(12) United States Patent
Chang et al.

(10) Patent No.: US 7,316,872 B2
(45) Date of Patent: Jan. 8, 2008

(54) ETCHING BIAS REDUCTION

(75) Inventors: Shih-Ming Chang, Hsin-Chu (TW); Chih-Cheng Chin, Taipei (TW); Wen-Chuan Wang, Taipei (TW); Chi-Lun Lu, Changhua (TW); Sheng-Chi Chin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 180 days.

(21) Appl. No.: 11/252,290

(22) Filed: Oct. 17, 2005

(65) Prior Publication Data

US 2007/0087571 A1    Apr. 19, 2007

(51) Int. Cl.
*G03F 1/00* (2006.01)
*G03C 5/00* (2006.01)

(52) U.S. Cl. .......................................... 430/5; 430/394
(58) Field of Classification Search .................... 430/5, 430/311–313, 322–323, 394; 216/41, 58
See application file for complete search history.

(56) References Cited

U.S. PATENT DOCUMENTS 5,766,803 A * 6/1998 Michael et al. ............... 430/5

6,569,761 B2 * 5/2003 Chang ........................ 438/637
2006/0024965 A1 * 2/2006 Yang ........................... 438/689
2006/0286690 A1 * 12/2006 Cao ............................. 438/14

OTHER PUBLICATIONS

Sato, Shunichiro, "Advanced Pattern Correction Method for Fabricating Highly Accurate Reticles", Photomask and Next Generation Lithography Mask Technology IX, Proceedings of SPIE, vol. 4754, 2002, pp. 196-204.

* cited by examiner

*Primary Examiner*—S. Rosasco
(74) *Attorney, Agent, or Firm*—Haynes Boone, LLP

(57) ABSTRACT

A patterning device for implementing a pattern on a substrate includes a main pattern feature and a sacrificial pattern feature. Both the main pattern feature and the sacrificial pattern feature are transferable to an overlying layer on the substrate. The sacrificial pattern feature is positioned a distance from the main pattern feature and is configured to have a dimension less than an etching bias of an etching process. The etching process is capable of transferring the main pattern feature to an underlying layer, such that the sacrificial pattern feature adjusts an etching behavior of the main pattern feature and is eliminated from the underlying layer.

13 Claims, 16 Drawing Sheets

Original Layout

ADI

ASI

ETCHING BIAS REDUCTION

BACKGROUND

In semiconductor technologies, critical-dimension (CD) variations can be induced by certain "effects" that occur during an etching process. Examples of such effects include the "sandwich effect," which is caused by the nearest spacing around the main pattern, and the "loading effect," which is related to the ratio of open areas and non-open areas. The effects tend to differently alter isolated patterns and dense patterns. The resulting variation in CD can be as high as 20 nanometers in one example.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6a through 6c are top views of an exemplary pattern at various manufacturing stages while

FIGS. 7a through 7c are top views of a pattern without a sacrificial feature at various manufacturing stages while

DETAILED DESCRIPTION

Figure 1:
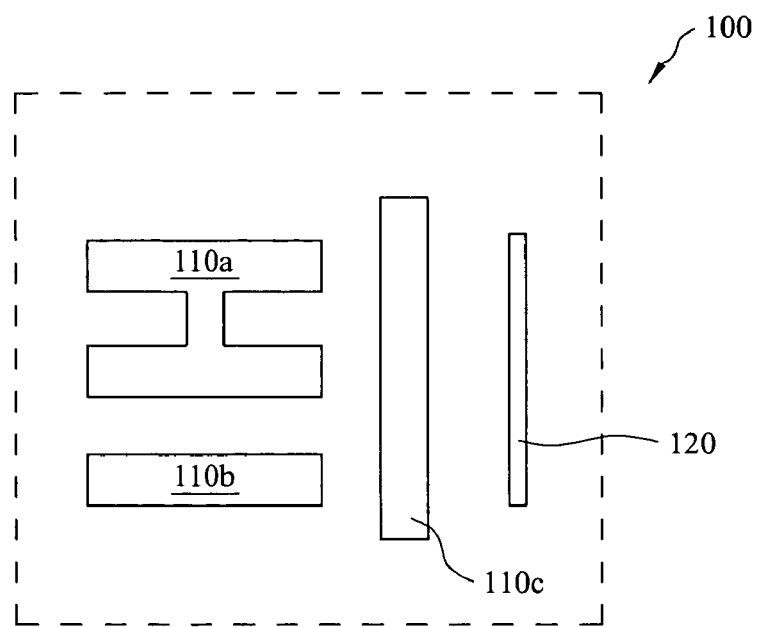
FIG. 1 is a top view of an embodiment of a pattern having a sacrificial feature.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a top view of an embodiment of a pattern 100 having a sacrificial feature. The pattern 100 can be utilized in manufacturing a photomask or a semiconductor wafer. The photomask (mask, or reticle, collectively referred to as mask) may be a conventional mask comprising a transparent substrate and an absorption layer coated thereon. The transparent substrate may use fused silica (SiO$_2$) relatively free of defects, calcium fluoride, or other suitable material. The absorption layer may be formed using a plurality of processes and materials, such as depositing a metal film made with chromium (Cr) and iron oxide, or an inorganic film made with MoSi, ZrSiO, SiN, and/or TiN. The absorption layer may be patterned to have one or more openings where light may travel through without being absorbed and have one or more absorption areas where light may be completely or partially blocked. The mask may further comprise other layers such as anti-reflective coating layers, and adhesion layers. The mask may be designed to incorporate other technologies such as phase shift mask (PSM) and optical proximity correction (OPC). The semiconductor wafer (or wafer) may have a semiconductor substrate comprising an elementary semiconductor, a compound semiconductor, and/or an alloy semiconductor. For example, the wafer may have a silicon substrate. The semiconductor wafer may further comprise a plurality of doped regions formed therein and a plurality of patterned conductive and dielectric structures therein and/or thereon.

The pattern 100 may comprise main features 110 including exemplary circuit features 110a, 110b, and 110c (collectively "main features" 110). The pattern 100 further comprises a sacrificial feature 120 positioned proximate the main features 110. As an example, the pattern 100 is a patterned photoresist layer formed on a semiconductor wafer or a mask. As another example, the pattern 100 may be a patterned hard mask layer such as a silicon nitride layer formed on a semiconductor wafer. In the present embodiment, the sacrificial feature 120 is designed having one dimension less than an etch bias of an etching process used to transfer the main features 110 to an underlying layer.

For simplicity in the following description of the present disclosure, a wafer is taken as an example. In this example, the sacrificial feature in the pattern 100 is utilized in fabricating semiconductor wafers. The sacrificial feature is designed to reduce or eliminate critical-dimension (CD) variations on the wafer during an etching process to pattern the wafer. In this example, a mask may be involved to carry a pattern to be transferred to the wafer.

Figure 2A:
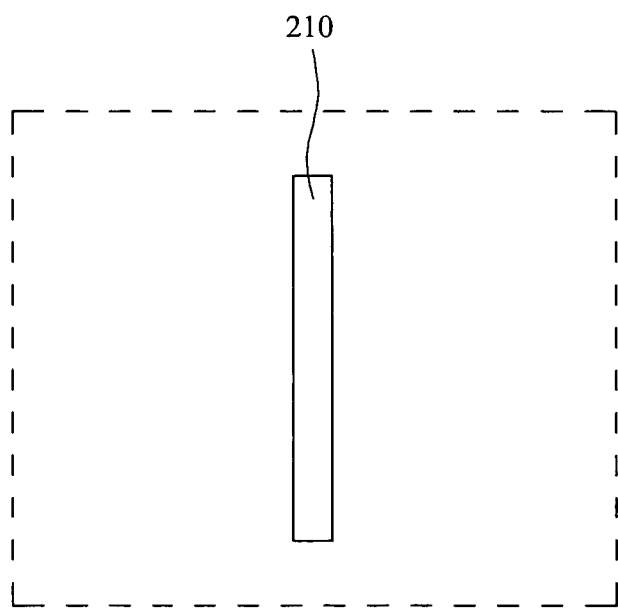
FIGS. 2a through 2d are top views of various examples illustrating pattern-related etching effects.
Figure 2B:
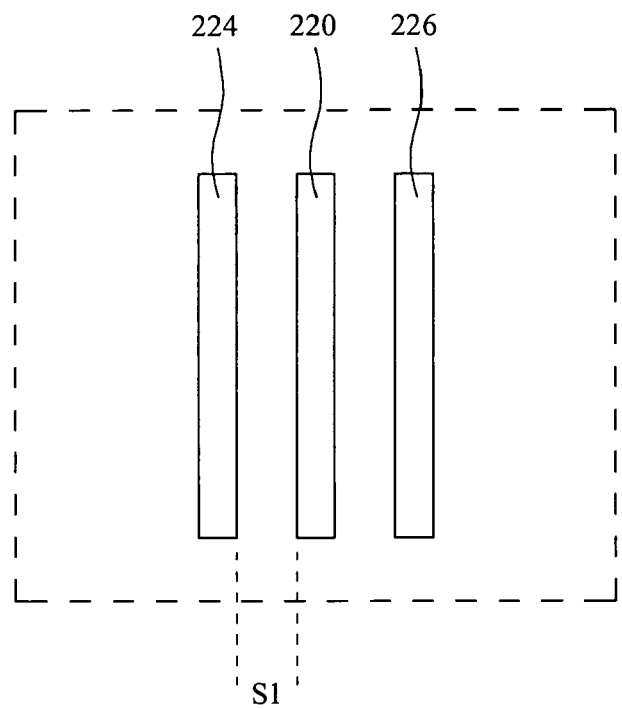
Figure 2C:
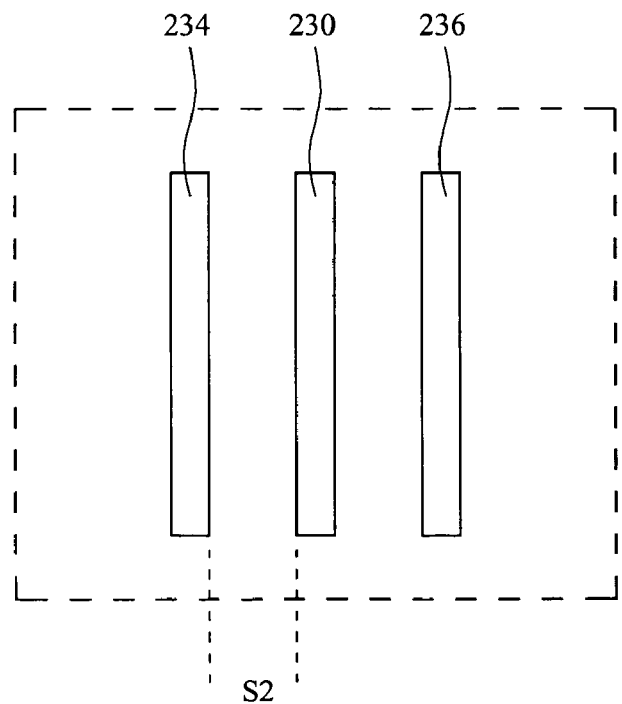
Figure 2D:
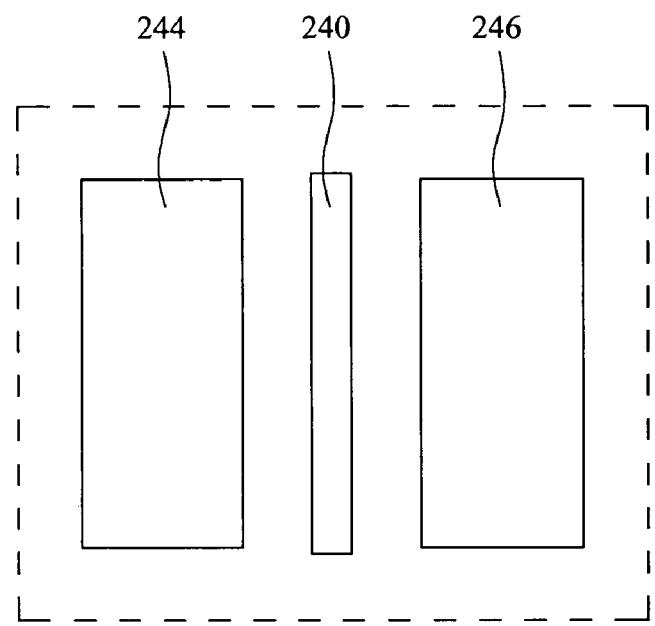
Figure 3A:
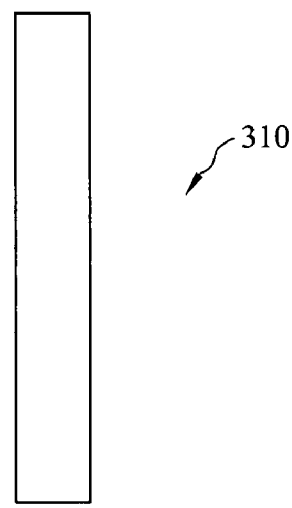
FIGS. 3a through 3f are top views of various embodiments of sacrificial features.
Figure 3B:
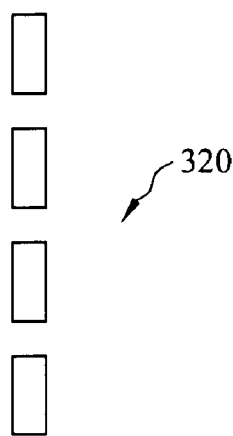
Figure 3C:
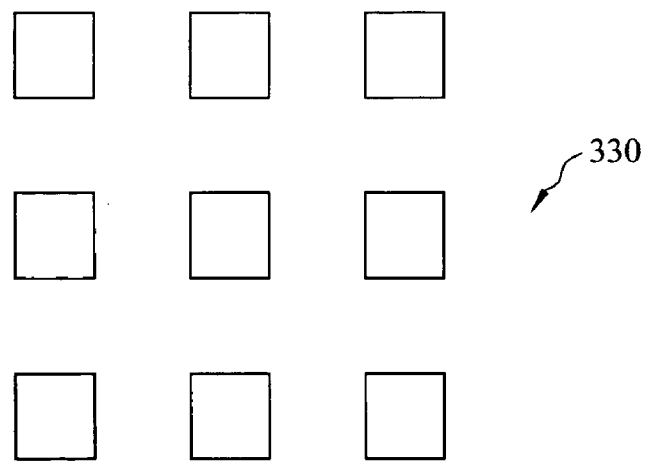
Figure 3D:
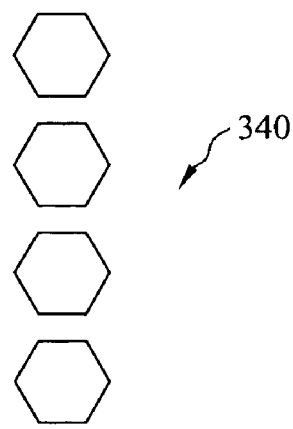
Figure 3E:
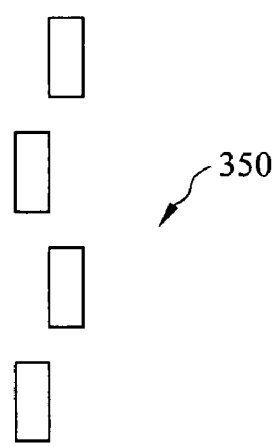
Figure 3F:
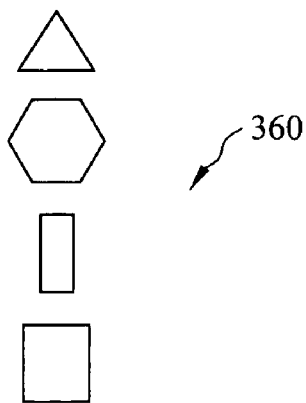

During patterning a semiconductor wafer, an etching process such as a dry etching may be implemented. The etching process may be anisotropic to substantially etch vertically. However, the etching process may still have a lateral etching rate. Furthermore, the lateral etching rate may be pattern-related. The etching rates may depend on a pattern within and/or surrounding the local region, as shown in several examples with reference to FIGS. 2a to 2d. Thus, a pattern transferred into an underlying layer by an etching process may be distorted. The critical dimension (CD) of the pattern may be out of specification. For example, a cause of an etching-related pattern distortion may include a micro (macro) loading effect wherein the etching rates depend on a local (or global) etching loading defined as a ratio of to-be-etched-away area to to-be-left-alone area (open area to non-open area). FIG. 2a illustrates a pattern having a raised line 210 and so has a higher etching loading. FIG. 2d illustrates a pattern having raised features 240, 244, and 246 and so has a lower etching loading. In another example, a cause of an etching-related pattern distortion may include a sandwich effect wherein the etching rates depend on spacing between features. FIG. 2b illustrates a pattern having a raised line 220 and other two lines 224 and 226 disposed approximate the line 220, each having a distance S1 thereto. FIG. 2c illustrates a pattern having a raised line 230 and other two lines 234 and 236 disposed approximate the line 230, each having a distance S2 thereto, with S2 larger than S1.

The sacrificial feature 120 may be incorporated into the main features 110 with proper shape, dimension, and configuration to tune micro (or macro) etching loading and spacing such that the micro (and/or macro) loading effect and the sandwich effect are substantially reduced and the CD control is optimized during patterning a wafer using an etching process.

The sacrificial feature 120 may have at least one dimension such as a width less than an etching bias such that the sacrificial feature can be formed on the wafer by a lithography process including exposure and development and can be etched away by an etching process thereafter. Thus a sacrificial feature may be incorporated to compensate etching-pattern-related effects without footprint on a wafer. For example, a lateral etching to a wafer coated with a patterned photoresist layer may transfer the photoresist-defined pattern to an underlying layer while the width of a line may be shrunk by an offset, referred to as an etching bias. The etching bias is an etching-patterned-related parameter and may change from location to location. The sacrificial feature 120 has a dimension less than a local etching bias and disappears after the completion of the etching.

In one example, a wafer is coated with a photoresist layer. The photoresist layer may be exposed to form a pattern such as the pattern 100 having the sacrificial feature 120. Then a layer underlying the patterned photoresist layer is etched to transfer the main features 110 from the patterned photoresist layer while the sacrificial feature 120 is etched away from the underlying layer since the sacrificial feature 120 has at least one dimension less than the etching bias (specifically, a local etching bias).

The patterning of the photoresist layer may not be limited to a conventional photolithography method comprising an optical exposure using a mask. The patterning may be implemented or replaced by other proper methods such as maskless photolithography, electron-beam writing, ion-beam writing, and molecular imprint as long as the predefined pattern has the sacrificial feature 120. The pattern 100 having the sacrificial feature 120 may also be formed on a mask if the mask is used to expose a wafer during a lithography process. The pattern 100 may be stored in a file and used as a pattern source to be transferred to a wafer by other lithography method such as maskless lithography.

The pattern 100 having the sacrificial feature 120 may not be limited to a photoresist layer. It may be formed in an etching stop layer (ESL). For example, silicon nitride may be deposited on a wafer to form as an ESL and patterned to have the sacrificial feature 120. The patterned ESL is then used as a hard mask to transfer the main features 110 onto an underlying layer using an etching process wherein the sacrificial feature 120 reduces pattern-related etching effects (such as loading effects and sandwich effect) and is disappeared after the etching process.

Referring to FIGS. 3a through 3f, illustrated are top views of various embodiments of the sacrificial features. A sacrificial feature may not be limited to a line feature such as a line 310 shown in FIG. 3a. The sacrificial feature 120 may comprise a broken line 320 (FIG. 3b), an array of squares (or rectangles) 330 (FIG. 3c), a column of polygons 340 (FIG. 3d), a distributed bars 350 (FIG. 3e), a combination of various geometric features 360 (FIG. 3f), and/or combinations thereof. In the present embodiment, the sacrificial feature 120 may comprise other suitable shapes as long as each has a dimension less than an etching bias of an etching process to transfer a main pattern to an underlying layer.

Figure 4A:
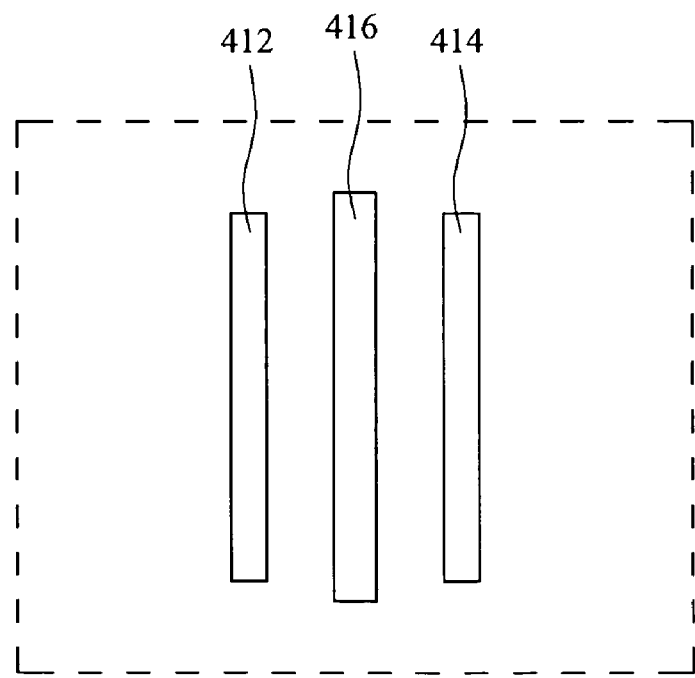
FIGS. 4a through 4f are top views of various embodiments of patterns having at least one sacrificial feature.
Figure 4B:
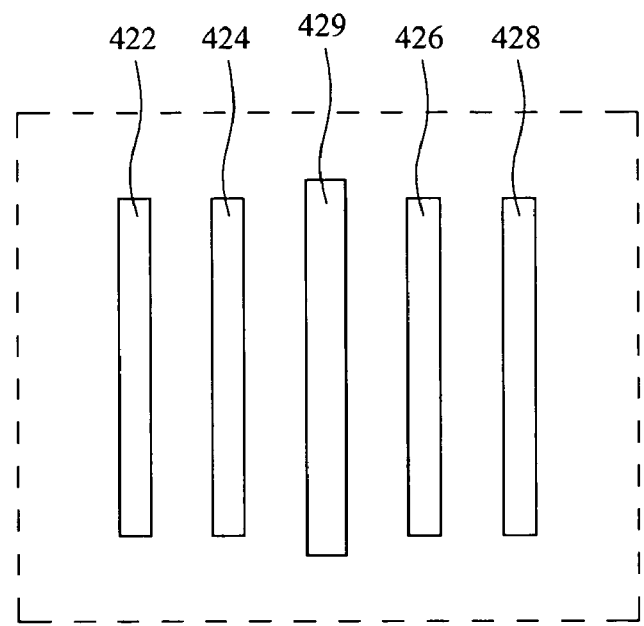
Figure 4C:
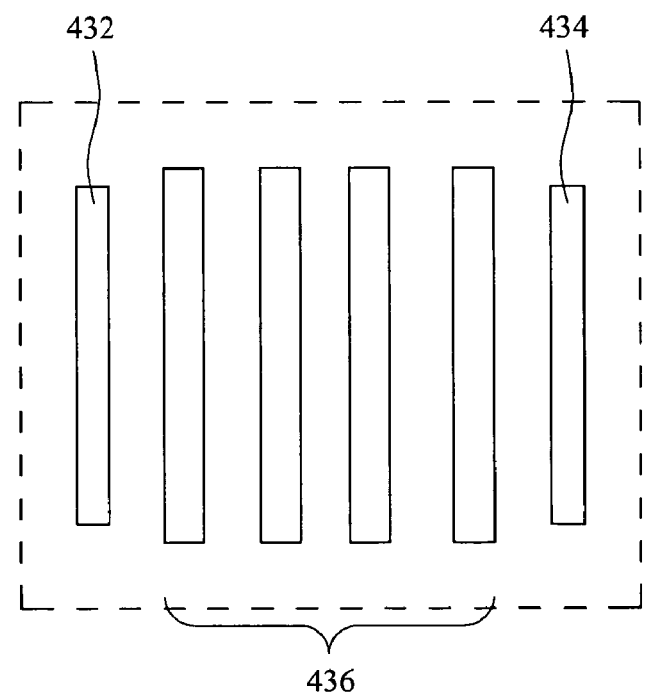
Figure 4D:
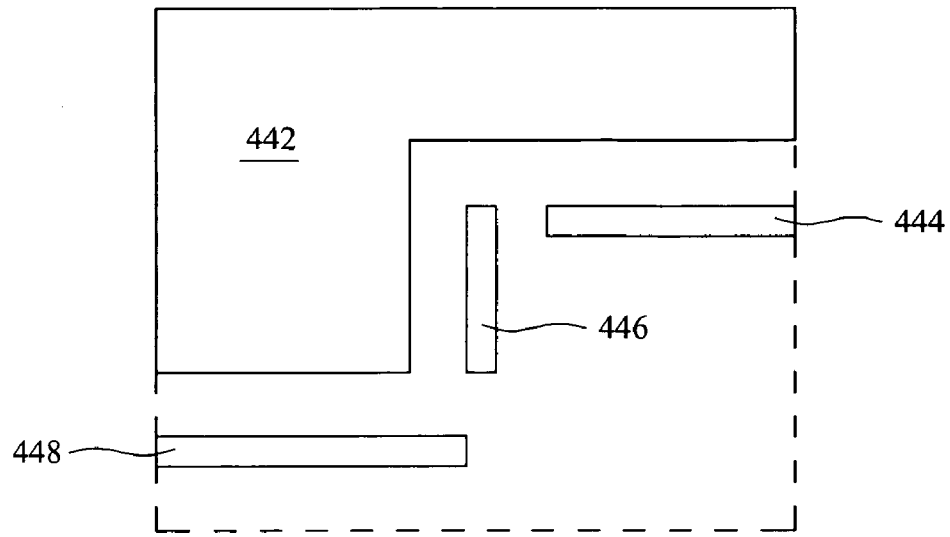
Figure 4E:
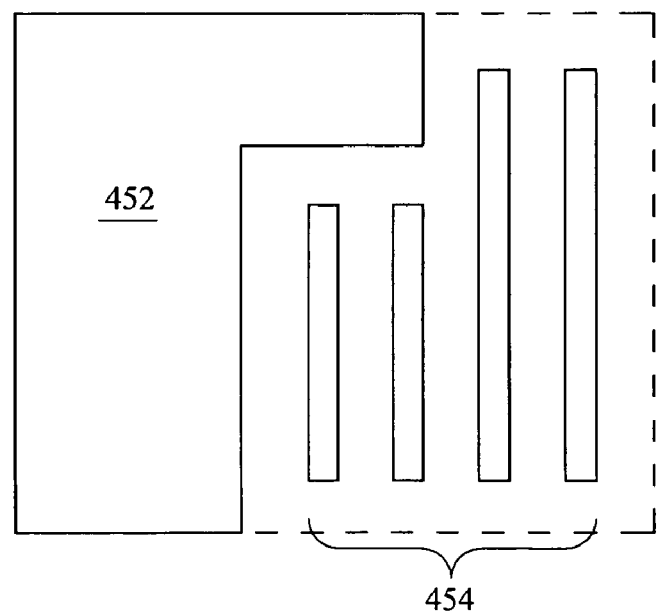
Figure 4F:
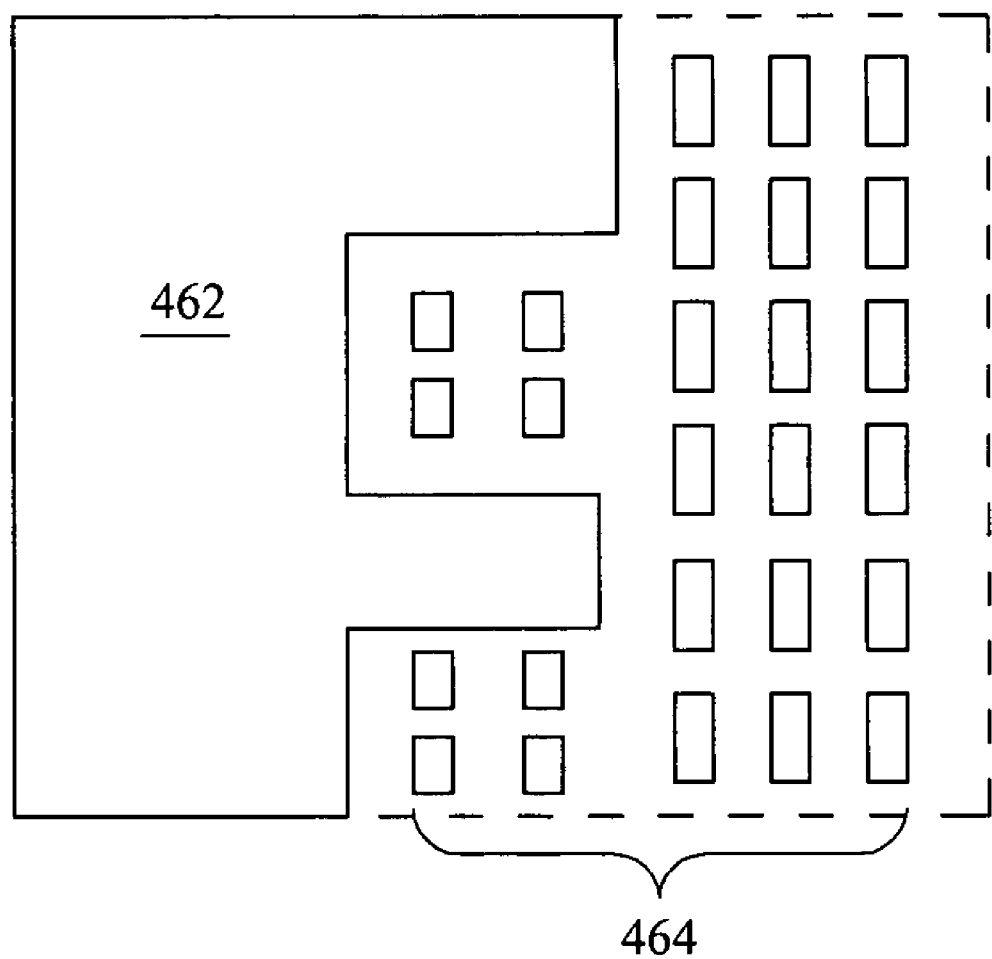

Referring to FIGS. 4a through 4f, illustrated are top views of embodiments of various patterns each comprising at least one main feature and at least one sacrificial feature incorporated therein. As shown in FIG. 4a, a pattern comprises an isolated main feature 416 and two sacrificial features 412 and 414 disposed on each side of the main feature with a proper distance. In another embodiment, a pattern may comprise an isolated main feature and more than one sacrificial features disposed on each side of the main feature. For example, a pattern in FIG. 4b comprises an isolated main feature 429 and sacrificial features 422 and 424 disposed on one side and sacrificial features 422 and 424 disposed on the another side of the main feature. A main feature may be partially isolated (or referred to as semi-isolated) and so have at least one sacrificial feature disposed approximate the main feature to substantially reduce pattern-related etching effects. For example, sacrificial features 432 and 434 are disposed around a partially-isolated feature 436 as illustrated in FIG. 4c. In another example shown in FIG. 4d, sacrificial features 444, 446, and 448 are disposed around partially-isolated main feature 442. A sacrificial feature may also be used in an open area to substantially reduce macro etching loading effect. In one example illustrated in FIG. 4e, sacrificial features 454 are disposed in an open space proximate a main pattern 452 wherein the sacrificial features 454 comprise a plurality of lines similar to the line 310 of FIG. 3a. In another example illustrated in FIG. 4f, sacrificial features 464 are disposed in an open space approximate a main pattern 462 wherein the sacrificial features 464 comprise an array of rectangles similar to the array 330 of FIG. 3c.

Figure 5:
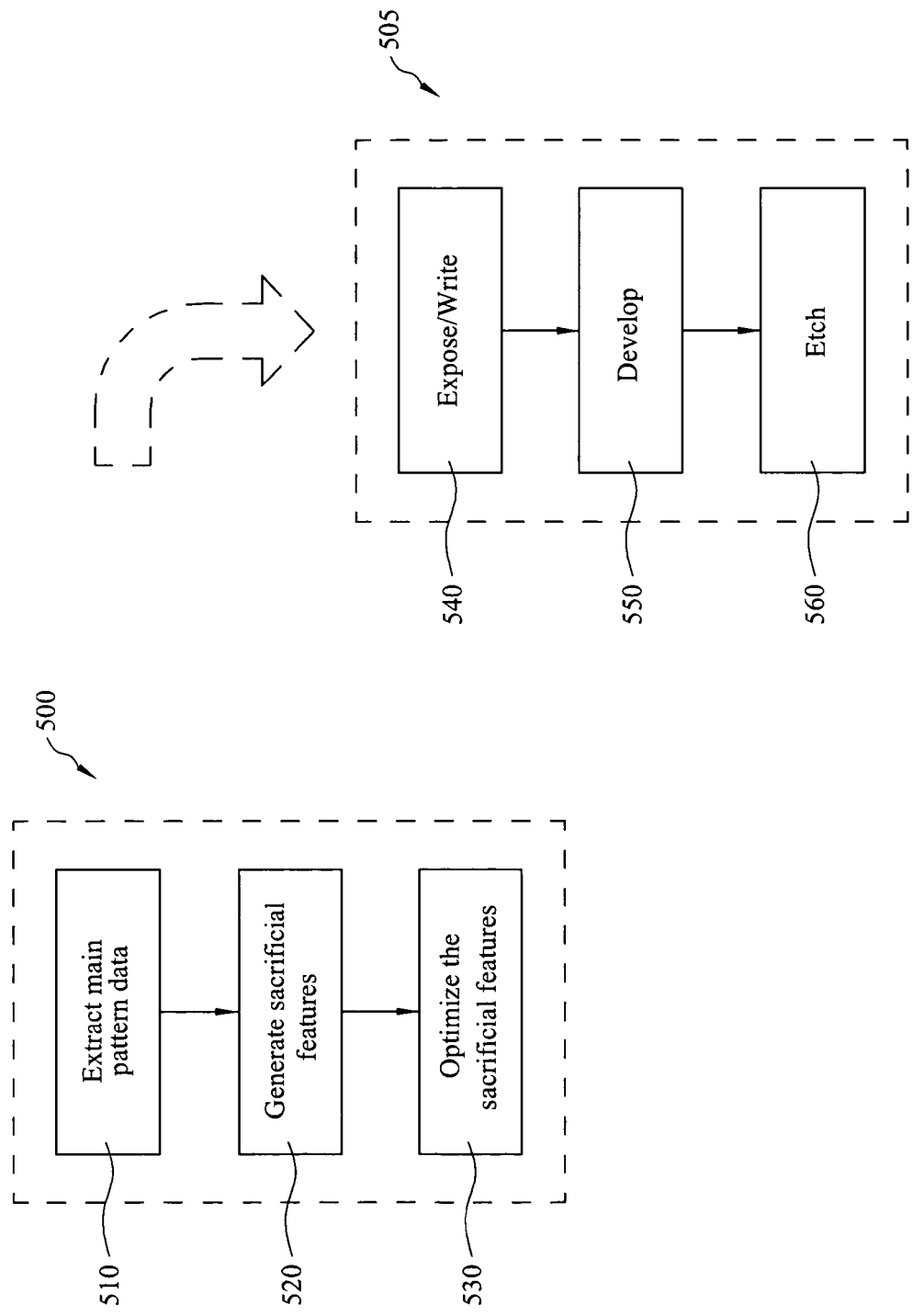
FIG. 5 is a flow chart of a method to implement the sacrificial features.

Referring to FIG. 5, illustrated is a flow chart of one embodiment of a method 500 to design and a method 505 to implement sacrificial features. The method 500 may begin at step 510 by extracting data from a main feature. At next step 520, various sacrificial features are generated and disposed using a different method such as a rule-based method and a model-based method. The rule-based method may use predefined standard sacrificial features such as rectangles and place them in proper locations, distance, density, and configuration. The model-based method may generate proper sacrificial features in proper shapes, dimensions, locations, distance, and density to change the etching pattern locally and/or globally such that pattern-related etching effects and induced CD variation are substantially reduced. At step 530, the method 500 may take an error-trial approach to optimize the sacrificial features such that the CD variation is minimized. Thus, the designed pattern may form a tape-out file for fabricating a mask and the mask is further used for fabricating wafers using a lithography process such as the method 505 described below. Alternatively, the designed pattern may form a database to directly pattern a wafer using other methods such as maskless lithography, electron-beam writing, ion-beam writing, and molecular imprint.

The method 505 of implementing sacrificial features may begin at step 540 wherein a photoresist layer coated on a semiconductor wafer may be exposed under a mask having a pattern comprising at least one main feature 110 and at least one sacrificial feature 120. The pattern may be similar to the pattern 100 of FIG. 1 and may be designed by the method 500. At next step 550, the photoresist layer is developed such that the photoresist layer is patterned to have the pattern transferred from the mask pattern. At next step 560, the wafer may be etched under the patterned photoresist layer to transfer the main feature onto an underlying layer while the sacrificial features are etched away after the etching process. The method 505 may further include other processing steps as a normal lithography may have. An exemplary lithography process may include photoresist patterning, etching, and photoresist stripping. The photoresist patterning may further include processing steps of photoresist coating, soft baking, mask aligning, exposing, postexposure baking, developing photoresist, and hard baking. Lithography patterning may also be implemented or replaced by other suitable methods such as maskless photolithography, electron-beam writing, ion-beam writing, optical writing, and molecular imprint.

Figure 6A:
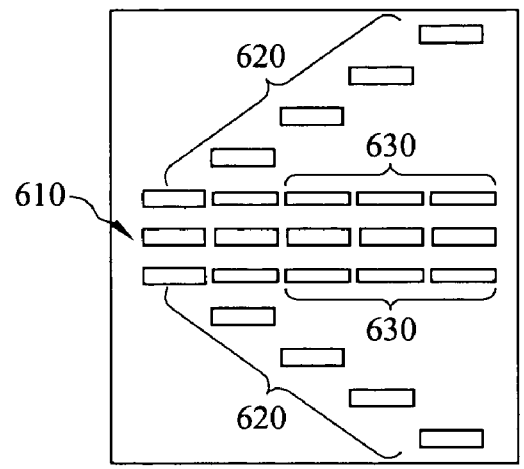
Figure 6B:
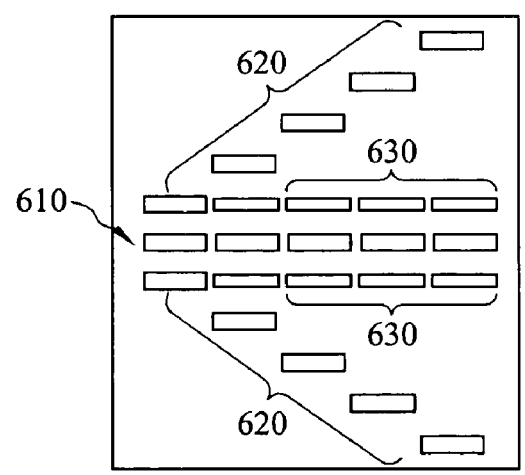
Figure 6C:
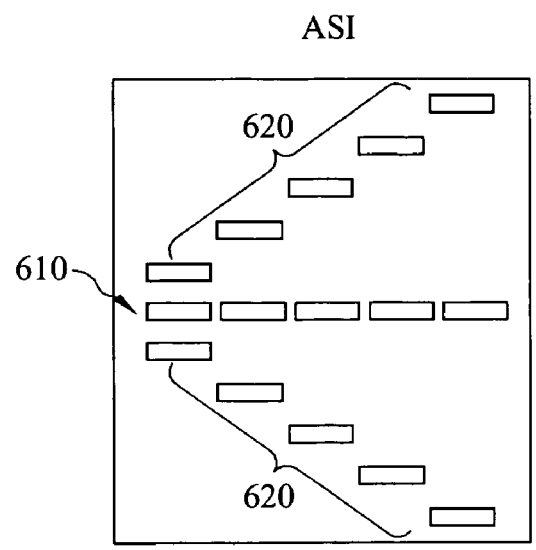
Figure 6D:
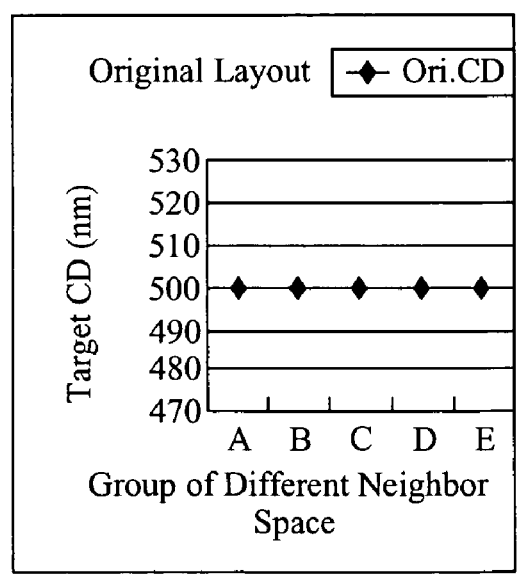
FIGS. 6d through 6f are critical dimension (CD) characterization charts of the exemplary pattern at corresponding manufacturing stages.
Figure 6E:
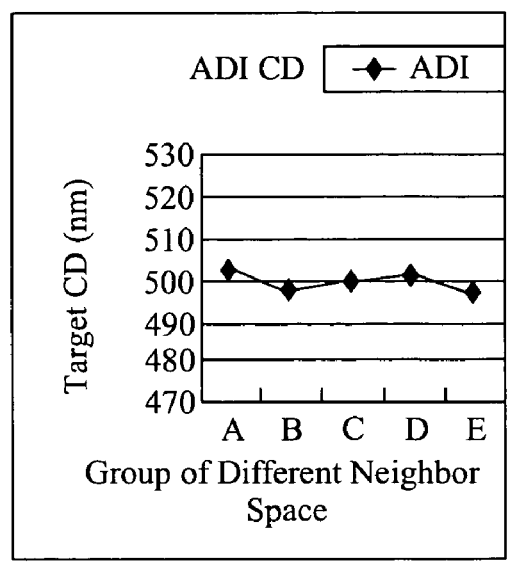
Figure 6F:
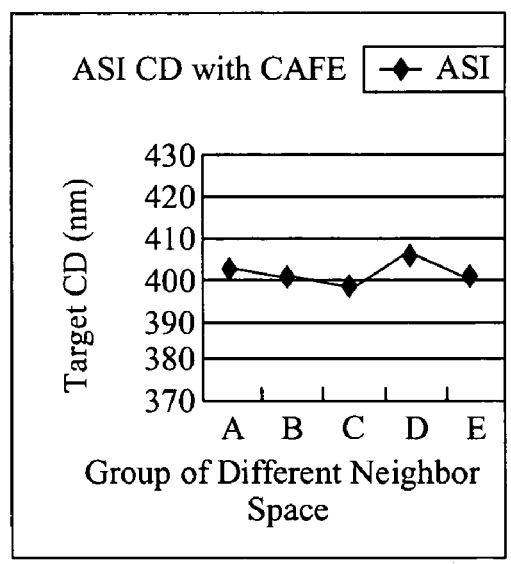

FIGS. 6a through 6c illustrate top views of an exemplary pattern at various manufacturing stages while FIGS. 6d through 6f show critical dimension (CD) characterization charts of the exemplary pattern at corresponding manufacturing stages wherein the exemplary pattern comprises a plurality of main features and a plurality of sacrificial features. The original layout shown in FIG. 6a may be a mask pattern which has a main feature 610 comprising a series of bars and another main feature 620 comprising a plurality of bars that fan out and form various distances between the main features 610 and 620. The original pattern further has a sacrificial feature 630 comprising a plurality of bars, each having a width less than an etching bias, disposed on both sides of the main feature 610. FIG. 6d shows CD variation over distances between the main features 610 and 620. When the original layout on the mask pattern is transferred to a photoresist layer coated on a semiconductor wafer by a lithography process including exposure and development, a pattern of the photoresist layer at after-development-inspection (ADI) is shown in FIG. 6b while the FIG. 6e shows CD variation over distances between the main features 610 and 620 at the ADI step. Then the photoresist pattern is further transferred to an underlying layer on the wafer by an etching process such as a dry etching. The photoresist layer is stripped afterward. The pattern of the underlying layer at after-stripping-inspection (ASI) is shown in FIG. 6c wherein the main features 610 and 620 survive but the sacrificial feature 630 is etched away. The FIG. 6f shows CD variation over distances between the main features 610 and 620 at the ASI step. The CD variation due to spacing variation is substantially reduced since the sacrificial feature 630 modifies the spacing and the etching pattern density.

Figure 7A:
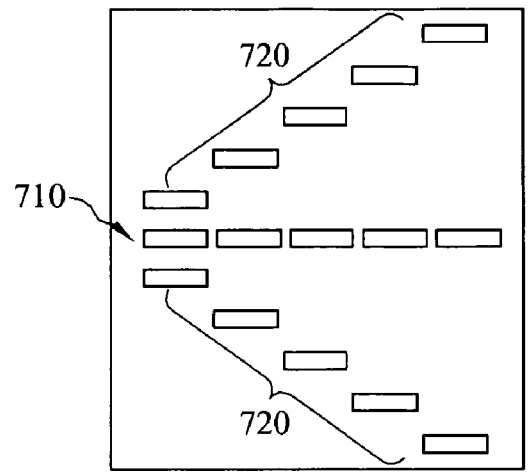
Figure 7B:
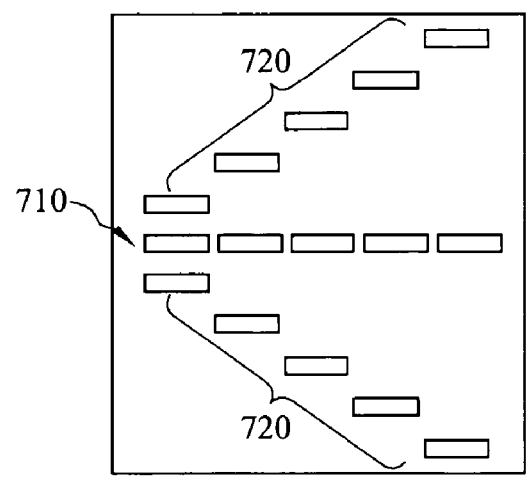
Figure 7C:
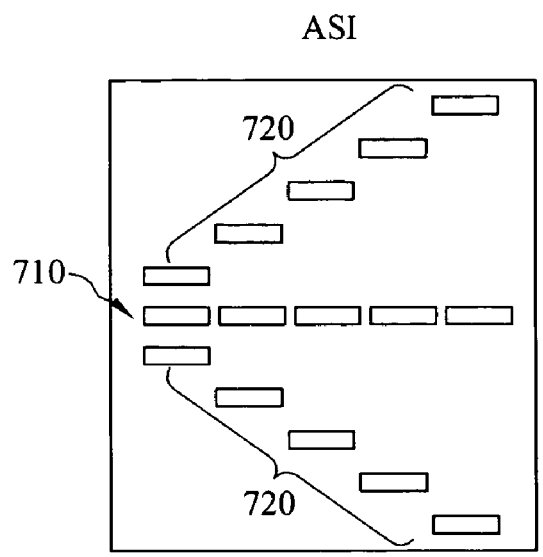
Figure 7D:
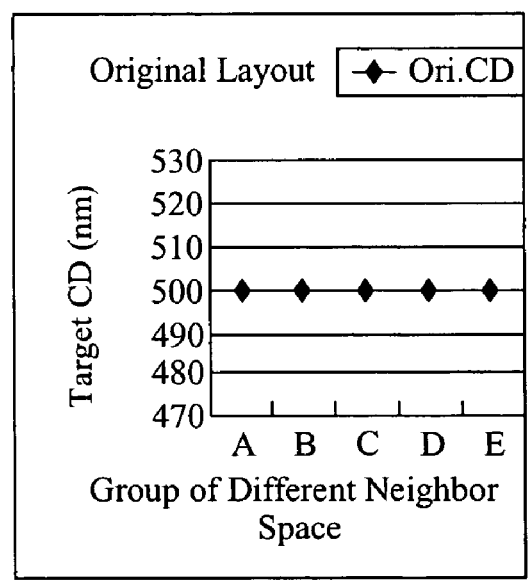
FIGS. 7d through 7f are CD characterization charts of the pattern at corresponding manufacturing stages.
Figure 7E:
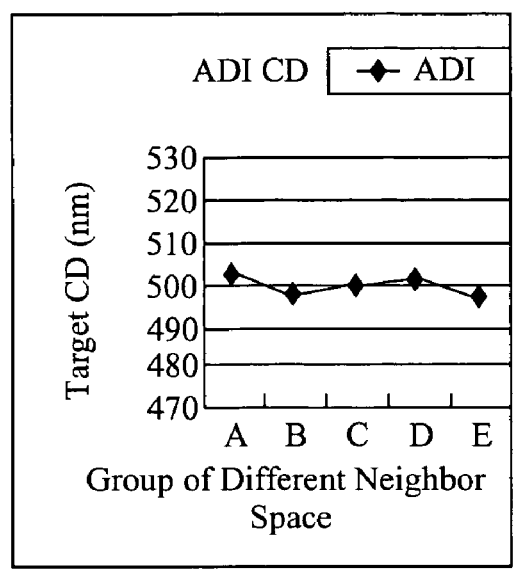
Figure 7F:
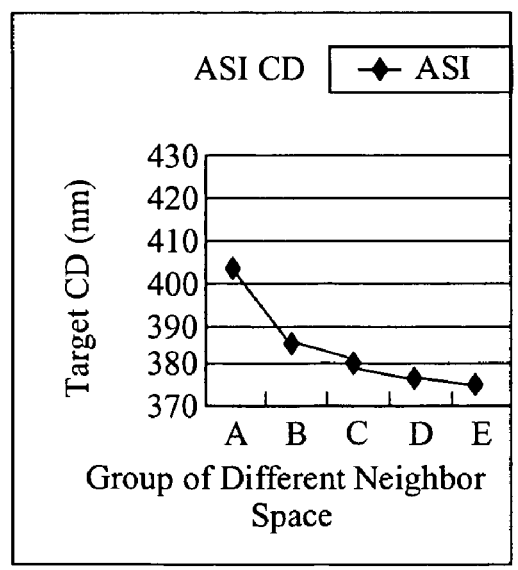

As a comparison, FIGS. 7a through 7c illustrate top views of a pattern without a sacrificial feature at various manufacturing steps while FIGS. 7d through 7f show CD characterization charts of the pattern at corresponding manufacturing stages F. FIG. 7a is an original pattern. Fig in a mask. 7b is a transferred pattern in a photoresist layer at ADI step. Fig in a mask. 7c is a transferred pattern in an underlying layer at ASI step. In FIG. 7f, the CD variation increases when the spacing increases.

Thus the present disclosure provides a pattern structure comprising an main feature defined in an overlying layer on a substrate; a sacrificial feature defined in the overlying layer, wherein the sacrificial feature is positioned a distance from the main feature and is configured to have a dimension less than an etching bias of an etching process, transferring the main feature to an underlying layer, such that the sacrificial feature adjusts etching behavior of the main feature and is eliminated from the underlying layer.

In some methods, the overlying layer comprises a layer of photoresist. The substrate comprises a semiconductor material. The main feature comprises an integrated circuit pattern. The etching process comprises a dry etch. The main feature may comprise an isolated feature. The main feature may comprise a semi-isolated feature. The sacrificial feature comprises a feature selected from the group consisting of a line, a broken line, a square array, and combinations thereof. The substrate is a semiconductor wafer or a mask.

The present disclosure provides a mask layout having a sacrificial feature to make a semiconductor wafer with a reduced critical-dimension (CD) variation. The mask layer may comprise a first feature defined on a mask substrate; a sacrificial feature defined on the mask substrate, wherein the sacrificial feature is positioned a distance from the first feature and is configured to have a less dimension such that the sacrificial feature is transferred with the first feature to a photoresist layer on the semiconductor wafer during a photolithography process and is disappeared when the first feature is transferred to the semiconductor wafer during an etching process. In the mask layout, the sacrificial feature on the mask substrate may comprise an absorbing region. The sacrificial feature may comprise a transparent region.

The present disclosure provides a method of compensating an etching bias to a pattern. The method comprises forming the pattern and a sacrificial feature in an overlying layer on a substrate; and etching the substrate under the overlying layer to transfer the pattern thereto and the sacrificial feature is eliminated from the substrate.

In this method, forming the pattern and sacrificial feature may further comprise exposing a photoresist layer on a substrate and developing the photoresist layer to form the pattern and the sacrificial feature in the photoresist layer. Exposing the photoresist layer may further comprise directing a radiation beam onto the photoresist layer. The radiation beam is selected from the group consisting of photon, electron, and ion.

The present disclosure provides a method of designing an integrated circuit (IC) pattern having a sacrificial feature. The method comprises extracting data from the IC pattern; and generating the sacrificial feature based on the IC pattern wherein the sacrificial feature has a dimension less than an etching bias of an etching process to transfer the IC pattern to a substrate.

In this method, the sacrificial feature is defined proximate an isolated feature of the IC pattern. The sacrificial feature is also defined proximate a semi-isolated feature of the IC pattern. The sacrificial feature may be further defined in an open area of the IC pattern, having a high etching loading. The generating the sacrificial feature may comprise providing the sacrificial feature with its position, shape, dimensions, orientation, and distance to other features.

The above-mentioned pattern and method can be used in patterning a wafer with reduce CD variations. However, a similar pattern or method may be alternatively used in patterning a mask with reduced CD variations. Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A patterning device for implementing a pattern on a substrate, the patterning device comprising:
   a main pattern feature to be defined in an overlying layer on the substrate; and
   a sacrificial pattern feature to be defined in the overlying layer, wherein the sacrificial pattern feature is positioned a distance from the main pattern feature and is configured to have a dimension less than an etching bias of an etching process;

wherein the etching process is capable of transferring the main pattern feature to an underlying layer, such that the sacrificial pattern feature adjusts an etching behavior of the main pattern feature and is eliminated from the underlying layer.

2. The patterning device of claim 1 wherein the overlying layer comprises a layer of photoresist.

3. The patterning device of claim 1 wherein the substrate comprises a semiconductor material.

4. The patterning device of claim 1 wherein the main pattern feature comprises an integrated circuit pattern.

5. The patterning device of claim 1 wherein the etching process comprises a dry etch.

6. The patterning device of claim 1 wherein the main pattern feature comprises an isolated feature.

7. The patterning device of claim 1 wherein the main pattern feature comprises a semi-isolated feature.

8. The patterning device of claim 1 wherein the sacrificial pattern feature comprises a feature selected from the group consisting of a line, a broken line, a square array, and combinations thereof.

9. The patterning device of claim 1 wherein the substrate is a semiconductor wafer.

10. The patterning device of claim 1 wherein the substrate is a mask.

11. A mask to make a semiconductor wafer with a reduced critical-dimension (CD) variation, comprising:
 a first feature defined on a mask substrate;
 a sacrificial feature defined on the mask substrate, wherein the sacrificial feature is positioned a distance from the first feature and is configured to have a less dimension such that the sacrificial feature is transferred with the first feature to a photoresist layer on the semiconductor wafer during a photolithography process and is eliminated when the first feature is transferred to the semiconductor wafer during an etching process.

12. The mask of claim 11 wherein the sacrificial feature on the mask substrate comprises an absorbing region.

13. The mask of claim 11 wherein the sacrificial feature comprises a transparent region.

* * * * *